US005557651A

United States Patent [19]
Wissman

[11] Patent Number: 5,557,651
[45] Date of Patent: Sep. 17, 1996

[54] SIGNAL GENERATOR FOR TRACING MULTIPLE TRANSMISSION LINES

[75] Inventor: Charles H. Wissman, Oceanside, Calif.

[73] Assignee: Tempo Research Corporation, Vista, Calif.

[21] Appl. No.: 461,687

[22] Filed: Jun. 5, 1995

[51] Int. Cl.$^6$ .............................. H04M 3/08; H04M 3/00; G01R 19/00
[52] U.S. Cl. .................... 379/6; 324/66; 379/26; 379/29; 379/246
[58] Field of Search .................................. 379/6, 22, 26, 379/27, 29, 15, 21, 246; 324/66, 527, 528, 535, 536

[56] References Cited

U.S. PATENT DOCUMENTS

| | | | |
|---|---|---|---|
| 4,393,491 | 7/1983 | Ashlock et al. | 379/15 X |
| 4,682,347 | 7/1987 | Lynch | 379/29 |
| 4,748,402 | 5/1988 | Sellati | 324/66 |
| 4,788,710 | 11/1988 | Lynch | 379/29 |

*Primary Examiner*—Jeffery Hofsass
*Assistant Examiner*—Harry S. Hong
*Attorney, Agent, or Firm*—Amster, Rothstein & Ebenstein

[57] ABSTRACT

An apparatus and method are provided for use in tracing transmission lines from a first location to a second location. The apparatus includes a signal generator, a timer/controller, a switching controller and a number of switches. In operation the switches are connected to transmission lines to be traced. The signal generator produces one or more unique signals. A unique signal pattern is applied to each transmission line by selectively opening and closing the switches connected to each transmission line, thereby allowing each transmission line to be traced from a first location to a second location by detection of the corresponding unique signal pattern.

19 Claims, 4 Drawing Sheets

| | | | | | |
|---|---|---|---|---|---|
| FIRST LINE PAIR 33 | FREQ 1 | OPEN | OPEN | FREQ 1 | • • • • |
| SECOND LINE PAIR 49 | FREQ 1 | FREQ 2 | OPEN | FREQ 1 | • • • • |
| THIRD LINE PAIR 65 | FREQ 1 | FREQ 2 | FREQ 3 | FREQ 1 | • • • • |
| | T$_1$ ←.3 sec→ | T$_2$ ←.3 sec→ | T$_3$ ←.3 sec→ | T$_4$ ←.3 sec→ | T$_5$ |

SIGNAL GENERATOR FOR TRACING MULTIPLE TRANSMISSION LINES

BACKGROUND OF THE INVENTION

The present invention relates to an improved method and apparatus for simultaneously tracing a plurality of transmission lines from a first location to a second location. Specifically, the present invention is useful for tracing a plurality of twisted pair telephone transmission lines contained within a telecommunications cable.

Modern copper telecommunications cables typically contain as many as 600 twisted wire pairs ("line pairs") and may extend several miles in length. Often it becomes necessary to monitor the performance of a given line pair or a number of line pairs within a telecommunications cable. For example, a technician may be required to trace a number of lines from one location to the next. Thus, in order to reduce the cost and the time required to trace the line pairs, it is highly desirable to be able to trace several line pairs simultaneously.

Prior art methods for tracing line pairs within telecommunications cables are, unable to simultaneously trace multiple line pairs. Each line pair must be traced individually. This is not only inefficient and expensive, but is also tedious when the ends of the telecommunications cable under test are separated by several miles.

Prior art apparatuses for tracing line pairs within telecommunications cables employ signal generators which apply square wave signals to a single line pair. These square wave signals are typically 5–10 volts in amplitude and have a frequency within the range of 400–1500 Hz. The signals may be continuous or may be switched between two frequencies to add a "warble" sound which is easier for an operator or technician to hear or detect.

In prior art methods, a signal generator is connected to one end of the telecommunications cable. Specifically, the signal generator is connected to the line pair to being traced. A high input impedance amplifier is then held in close proximity to the line pairs at the opposite end of the cable. When the amplifier is close to the actual line pair containing the square wave signal, the signal is capacitively coupled to the amplifier and becomes audible. If another line is to be traced, the signal generator must be disconnected from its current line pair and connected to the next line pair to be traced. Having to switch the square wave generator for each line pair to be traced (each "traced line pair"), is very time consuming particularly when the traced line pairs are part of a telecommunications cable several miles in length. Thus, there is a need in the art for a method and apparatus that will provide simultaneous tracing of several line pairs.

Accordingly, it is an object of the present invention to provide an improved method for tracing a plurality of transmission lines from a first location to a second location.

It is a further object of the invention to provide an apparatus for tracing a plurality of transmission lines from a first location to a second location.

Yet another object of the invention is to provide a method and apparatus for simultaneously tracing a plurality of transmission lines from a first location to a second location.

A further object of the invention is to provide a method and apparatus which allows one traced line to be easily distinguished from any other traced line.

Another object of the invention is to provide a method and apparatus that allows the human ear to be used to easily distinguish one traced line from any other traced line.

It is a still further object of the invention to provide a compact and cost effective apparatus that employs a single signal generator for use in simultaneously tracing a plurality of transmission lines.

Other objects, features and advantages of the present invention will become more fully apparent from the following detailed description of the preferred embodiment, the appended claims and the accompanying drawing in which:

DETAILED DESCRIPTION OF THE PREFERRED EMBODIMENT

Figure 1:
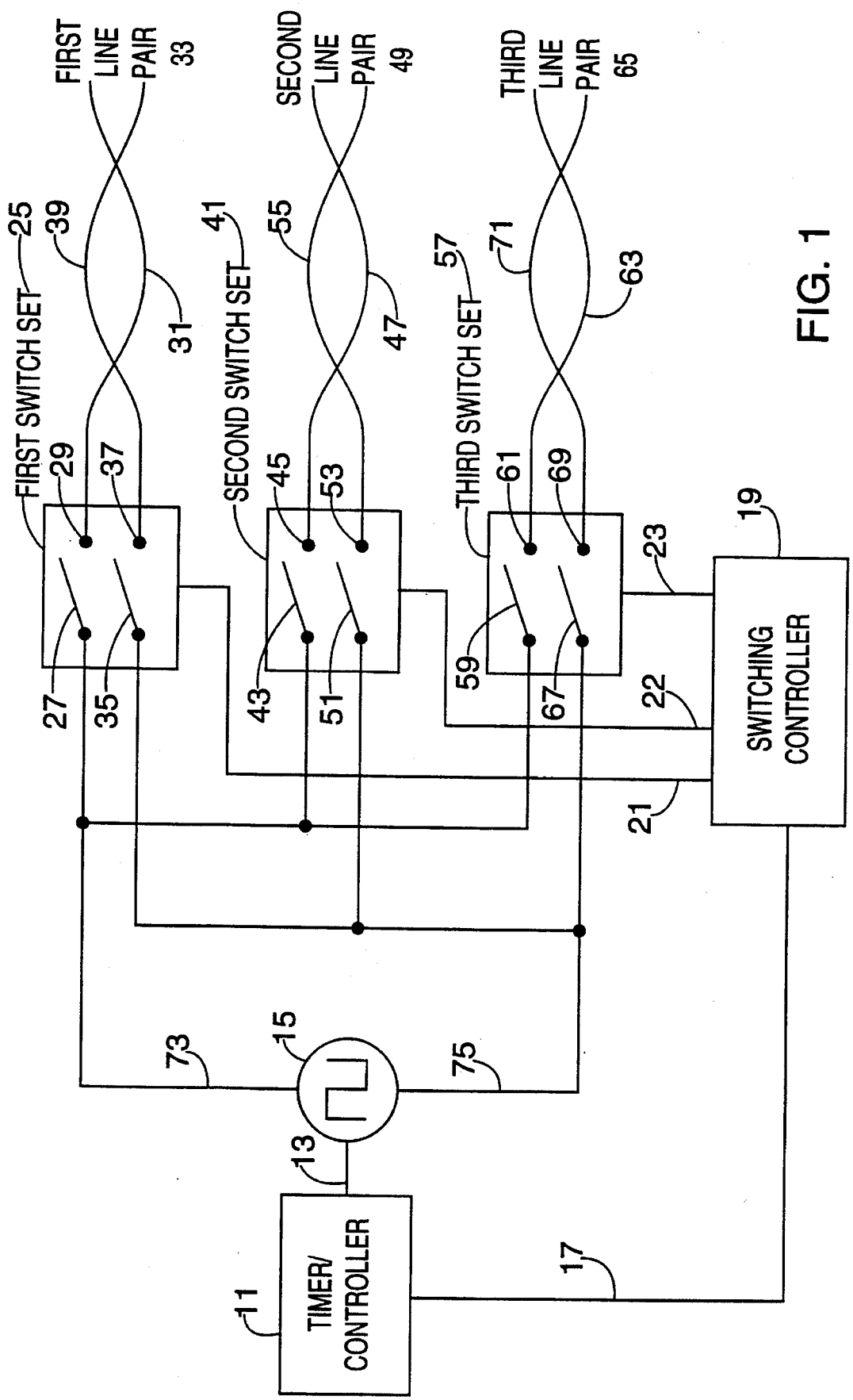
FIG. 1 is a simplified circuit diagram of a hardware implementation of the present invention.

The present invention reduces the time and cost associated with tracing transmission line pairs by allowing an operator to simultaneously trace a plurality of line pairs. Thus the present invention provides significant advantages over prior art apparatuses which allow tracing of only a single line pair at any given time. Employing the present invention, a technician is able to distinguish each traced line pair from the remaining traced line pairs. Upon detecting the tracing signal, a technician is able to determine not only that the line pair transmitting the signal is a traced line pair, but also is able to specifically determine whether the line pair which is transmitting the tracing signal is line pair 1, 2, or 3 etc.

The apparatus of the present invention comprises a signal generator capable of generating at least one signal and a number of switches for operatively coupling the signal (or signals) to a number of line pairs. Although the switches may be manually opened (disconnecting a given line pair) and closed (connecting a given line pair) and the timing for opening and closing the switches may be monitored manually, electronically controlled switches which are opened and closed at specified times in response to control signals output by an electronic timing and control circuit are preferred. In this manner at least one signal may be applied to each line pair in a specific timed sequence so as to apply a unique pattern to each line pair. In the preferred embodiment the signal generator is capable of generating a number of signals, each signal having a specific characteristic that differs from that of any other signal ("a unique characteristic"). In the preferred embodiment, frequency is the specific characteristic unique to each signal, as a technician is able to detect changes in frequency without the aid of instruments other than a simple hand held amplifier and speaker (known in the art) which is employed to amplify the frequency signals so that they may be more easily heard.

Specifically, in the preferred embodiment the electronically controlled switches take the form of a microcontroller input/output port containing a series of output bits which output either a high output signal ("1") or a low output signal ("0"). In the preferred embodiment the output bits repeatedly, and at a regular frequency, change their output signals from the high output signal to the low output signal (or vice versa). The frequency at which these input/output bits change their output signals is then varied to create a number of frequency signals (i.e., a first frequency signal which repeatedly switches between the high output signal and the low output signal at a first frequency, a second frequency signal which repeatedly switches between the high output signal and the low output signal at a second frequency, etc.) Each frequency is preferably in the audio range so that each frequency signal may be detected by the human ear. A unique set of these frequency signals is then repeatedly applied to each traced line pair in order to make each traced line pair easily distinguishable from the other traced line pairs. In the preferred embodiment these unique sets comprise a specific order or pattern of frequency signals which may or may not include a time period in which no signal is applied to the traced line pair ("open periods"). Further details of the invention are provided with reference to the attached drawing and the figures thereof.

Figure 2:
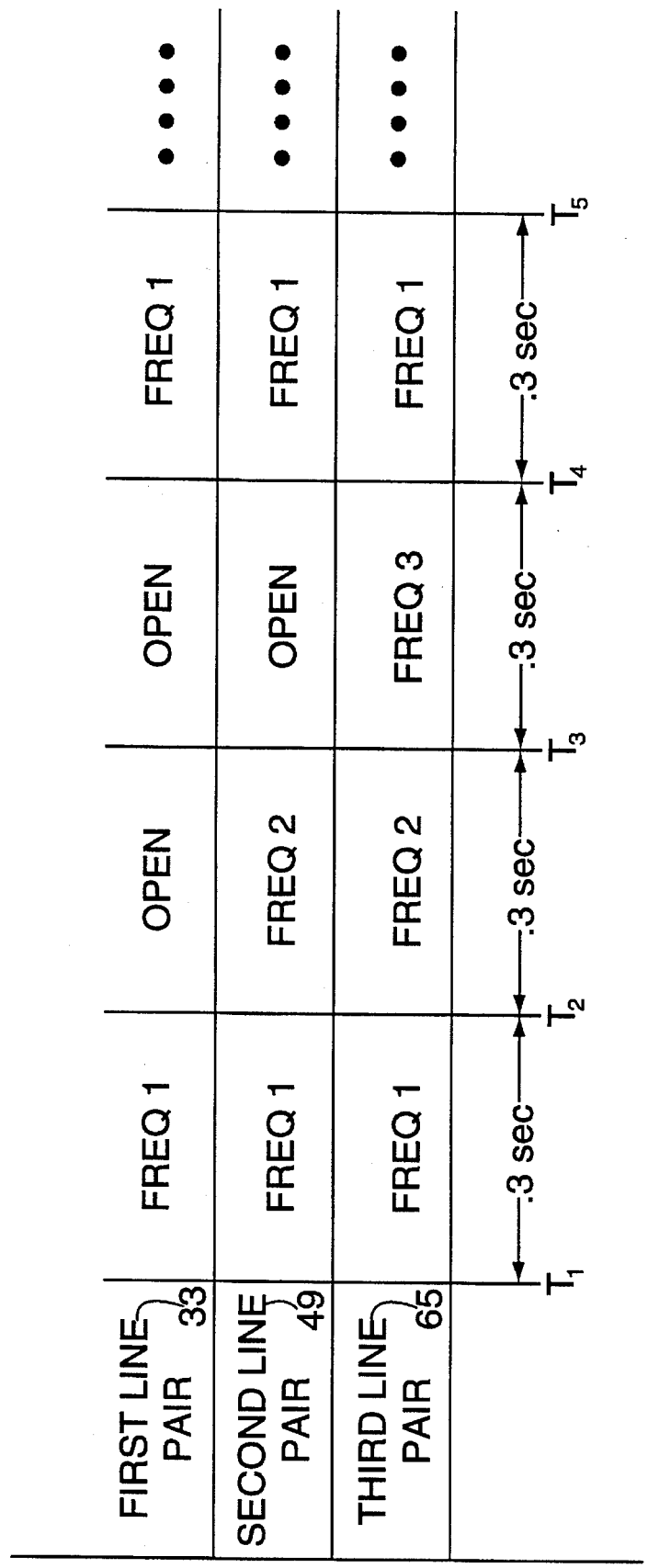
FIG. 2 is a simplified timing diagram describing the operation of the circuit of FIG. 1 and showing the unique set of frequencies applied to each traced line pair and the timing thereof.
Figure 3:
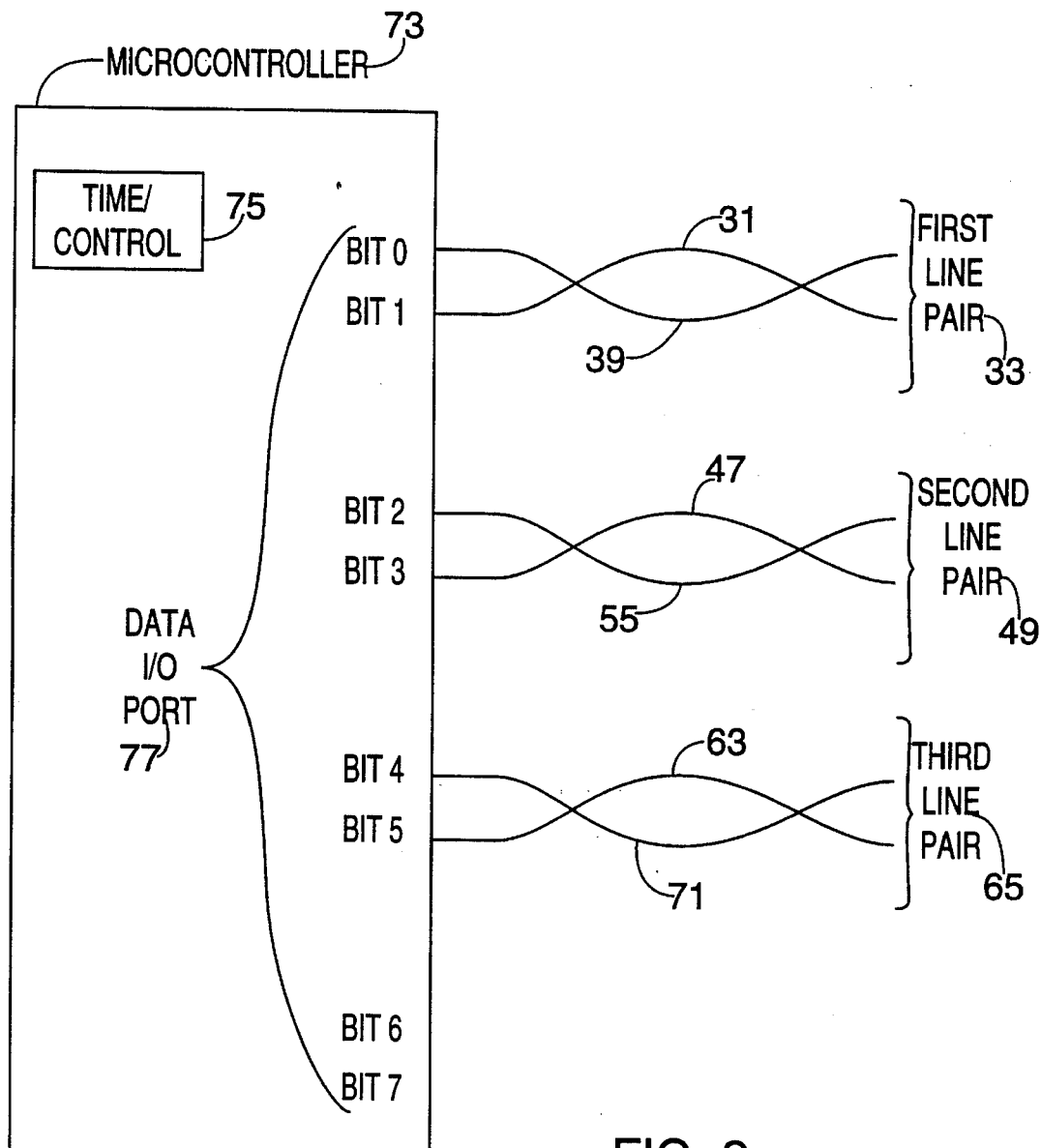
FIG. 3 is a simplified block diagram of the preferred microcontroller based embodiment of the present invention.

FIGS. 1 and 3 are alternative circuit configurations of the present invention. FIG. 1 is a simplified circuit diagram of a hardware implementation of the present invention in which a timer/controller 11 has a first timer output 13 coupled to a signal generator 15, and a second timer output 17 coupled to a switching controller 19. Switching controller 19 has a first control output 21, a second control output 22, and a third control output 23. First control output 21, second control output 22 and third control output 23 are operatively coupled to three sets of switches. A first switch set 25 comprises a switch 27 having a terminal 29 coupled to a line 31 of a first line pair 33, and a switch 35 having a terminal 37 coupled to a line 39 of first line pair 33. A second switch set 41 comprises a switch 43 having a terminal 45 coupled to a line 47 of a second line pair 49, and a switch 51 having a terminal 53 coupled to a line 55 of second line pair 49. A third switch set 57 comprises a switch 59 having a terminal 61 coupled to a line 63 of a third line pair 65, and a switch 67 having a terminal 69 coupled to a line 71 of third line pair 65. First control output 21 is operatively coupled to first switch set 25. Second control output 22 is operatively coupled to second switch set 41; and third control output 23 is operatively coupled to third switch set 57. Signal generator 15 has a first generator output 73 operatively coupled to switch 27, switch 43, and switch 59, and a second generator output 75 operatively coupled to switch 35, switch 51, and switch 67. The operation of the circuit of FIG. 1 is conveniently described with reference to the simplified timing diagram of FIG. 2 which depicts the unique set of frequencies applied to each traced line pair and the timing thereof.

In operation, when the apparatus of the present invention is turned on, switching controller 19 outputs control signals via first control output 21, second control output 22 and third control output 23 to first switch set 25, second switch set 41, and third switch set 57, respectively, to ensure that switches 27, 35, 43, 51, 59, and 67 are in a closed state (i.e., are in contact with terminal 29, 37, 45, 53, 61, and 69 respectively). Timer/controller 11 resets itself and outputs a signal via first timer output 13 to signal generator 15 causing signal generator 15 to output a first frequency signal having a first frequency. At a time $T_1$ the first frequency signal is output via first generator output 73 to switches 27, 43, and 59 and via second generator output 75 to switches 35, 51, and 67. As each switch 27, 35, 43, 51, 59 and 67 is closed, the first frequency signal is coupled through first switch set 25, second switch set 41, and third switch set 57 to lines 31, 39, 47, 55, 63, and 71. In the preferred embodiment the first frequency signal is applied to first line pair 33, second line pair 49, and third line pair 65 for a period of 0.3 seconds.

At a time $T_2$ timer/controller 11 outputs a signal to switching controller 19 via second timer output 17 causing switching controller 19 to output control signals (via first control output 21) to switch 27 and 35, causing switch 27 and switch 35 to open. Thus switch 27 and switch 35 are no longer in contact with terminals 29 and 37 respectively and the frequency signal generated by signal generator 15 is no longer coupled to lines 31 and 39 of first line pair 33. Also at $T_2$, timer/controller 11 outputs a signal via first timer output 13 to signal generator 15 causing signal generator 15 to output (via first signal generator output 73 and second signal generator output 75) a second frequency signal having a second frequency (the second frequency being different from the first frequency). The second frequency signal is coupled through second switch set 41 and third switch set 57 to second line pair 49 and third line pair 65, while no signal is coupled to line first pair 33 (due to the open state of switches 27 and 35) (see FIG. 2).

At a time $T_3$ timer/controller 11 outputs a signal to switching controller 19 via second timer output 17 causing switching controller 19 to output control signals via second control output 22 causing switch 43 and switch 51 to open, thus disconnecting first and second generator outputs 73 and 75 of signal generator 15 from lines 47 and 55 of second line pair 49. Also time $T_3$ at timer/controller 11 outputs a signal to signal generator 15 causing signal generator 15 to output a third frequency signal having a third frequency (the third frequency being different from the first and second frequencies). For a period of 0.3 seconds between time $T_3$ and time $T_4$, the third frequency signal is coupled to line 63 and line 71 of third line pair 65 while first switch set 25, and second switch set 41 are open. Thus, as shown by FIG. 2, first line pair 33, second line pair 49 and third line pair 65 each receive a unique set of frequency signals. Moreover, each frequency signal in a given unique set is received for a predetermined time period. First line pair 33 receives the first frequency signal for 0.3 seconds, followed by no signal for 0.6 seconds. Second line pair 49 receives the first frequency signal for 0.3 seconds, followed by the second frequency signal for 0.3 seconds, followed by no signal for 0.3 seconds. Third line pair 65 receives the first frequency signal for 0.3 seconds, followed by second frequency signal for 0.3 seconds, and the third frequency signal for 0.3 seconds. Thus, in the preferred embodiment, an operator may easily identify each line pair according to the number of frequency signals detected on the line pair (i.e. the first line pair transmits one frequency signal, the second line pair transmits two frequency signals and the third line pair transmits three frequency signals). Additional frequencies may be generated as the number of traced line pairs increases.

At a time $T_4$ and continuing thereafter until the tracing operation is complete, each unique set of signals is repeatedly applied to the respective line pair according to the predetermined time period. The repeated application of these timed unique sets of frequency signals allows each line pair to be easily identified from the remaining line pairs.

FIG. 3 is simplified block diagram of the preferred microcontroller implementation of the present invention wherein a microcontroller 73 comprises a timing/control circuit 75 operatively coupled to an input/output port 77. Input/output port 77 comprises of a series of bits (0, 1, 2, 3, 4, 5 . . . ) as labelled in FIG. 3. Each bit is connected to an individual line of a line pair. Bit 0 is connected to line 31 of first line pair 33 and bit 1 is connected to line 39 of first line pair 33. Similarly, bit 2 is connected to line 47 of second line pair 49 and bit 3 is connected to line 55 of second line pair 49. Likewise, bit 4 is connected to line 63 of third line pair 65 and bit 5 is connected to line 71 of third line pair 65, etc.

The bits of input/output port 77 may be individually placed in either a high or low impedance state. When a bit is in a low impedance state, it can control the voltage on a line of the traced line pairs. The low impedance state may be either a low voltage state (0 v) or a high voltage state (5 v). Thus each bit has three possible output states: A high voltage (5 v) (low impedance) state; a low voltage (0 v) (low impedance) state; and a high impedance state. When a bit is in a high impedance state, it cannot control the voltage on a line of the traced line pair. A high impedance state is analogous to an open switch while a low impedance state is analogous to a closed switch. Thus, by placing a bit in either a low or a high impedance state, one can effectively simulate the open or closed states of first switch set 25, second switch set 45 and third switch set 57 shown in FIG. 1.

Figure 4:
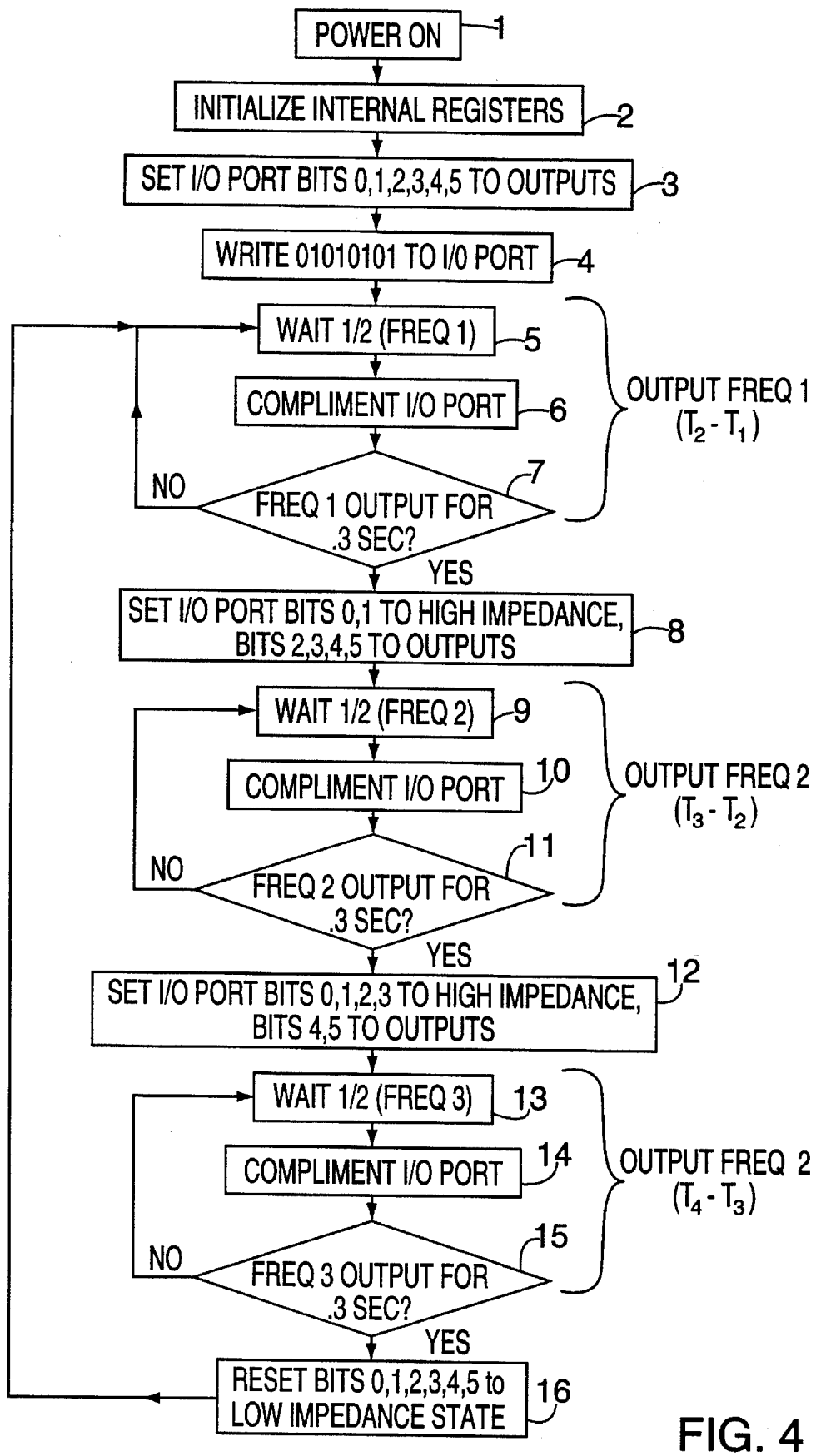
FIG. 4 is a simplified flow diagram describing the operation of the microcontroller of FIG. 3.

The operation of microcontroller 73 of FIG. 3 can be described with reference to FIG. 4 which is a simplified flow diagram describing the operation of microcontroller 73 of FIG. 3. Specifically, FIG. 4 shows a flow diagram of a program run by microcontroller 73 of FIG. 3 that implements the present invention for 3 traced line pairs. In describing the flow diagram of FIG. 4, numbered steps refer to the numbers as affixed to the flow diagram of FIG. 4.

Step 1 is the starting point of the program at which point, power is first applied to microcontroller 73 causing microcontroller 73 to reset itself and to execute instructions starting with Step 2.

Step 2, the registers that control the internal functions of microcontroller 73, are set to the appropriate values.

Step 3, the bits of input/output port 77 connected to the traced line pairs (connected to first line pair 33, second line pair 49, and third line pair 65) are designated as output bits (i.e., are set to a low impedance state so they may control the voltage on the respective traced line pairs connected thereto).

Step 4, the binary value "01010101" is written to bits 0 through 7 of input/output port 77. Zero denotes a low state (0 v) and "1" denotes a high state (5 v). Bits 0 through 7 are all in a low impedance state. That is, they are in an output state which allows them to control the voltage across each line of the traced line pairs. Thus 5 volts are applied across first line pair 33, second line pair 49, and third line pair 65.

Step 5, microcontroller 73 maintains the value presently written to bits 0 through 7 for half the period of a predesignated first frequency. For example, if the first frequency is 500 Hz, microcontroller 73 maintains the values presently written to output bits 0 through 7 for 1 msec.

Step 6, the binary value presently written to bits 0 through 7 are complemented. That is, the bits of input/output port 77 which are in the low voltage state (0 v) are switched to the high voltage state (5 v) and the bits of input/output port 77 which are in the high voltage state (5 v) are switched to the low voltage state (0 v). This complementing process is performed by writing "10101010" to input/output port 77 because "10101010" is the complement of the number "01010101" previously written to input/output port 77. Therefore, each time Step 6 is executed, the voltage across the traced line pairs (i.e., first line pair 33, second line pair 49, and third line pair 65 of FIG. 3) is reversed. Specifically, if prior to Step 6, bit 0 was in a low voltage state (0 v) and bit 1 was in a high voltage state (5 v), after Step 6, bit 0 will be in a high voltage state (5 v) and bit 1 will be in a low voltage state (0 v).

By repeatedly switching the bits connected to a trace line pair from a low voltage state (0 v) to a high voltage state (5 v), and from a high voltage state (5 v) to a low voltage state (0 v) at a regular interval (i.e., after the delay created by Step 5) a square wave signal is generated across the traced line pair. This square wave signal comprises a high voltage signal (5 v) for half the period of the first frequency and a low voltage signal for half the period of the first frequency. The frequency of this square wave signal is determined by the delay of Step 5 because the delay in Step 5 is significantly longer than any internal delays associated with Step 6.

Step 7, the time period during which the square wave signal having the first frequency has been generated is measured. One way this can be accomplished is by counting the number of times the program has looped through Steps 4, 5, and 6. If the time period the square wave signal having the first frequency has been generated is less than 0.3 seconds microcontroller 73 returns to Step 5. If the time period the square wave signal having the first frequency has been generated is greater than or equal to 0.3 seconds microcontroller 73 proceeds to Step 8.

Step 8, bits 0 and 1 are set to a high impedance (or input state) and bits 2, 3, 4, and 5 are set to a low impedance state. Setting bits 0 and 1 to a high impedance state while setting bits 2, 3, 4 and 5 to a low impedance state is equivalent to opening first switch set 25 and closing second switch set 41 and third switch set 57 of FIG. 1. Setting bits 0 and 1 to a high impedance state is effectively the same as physically disconnecting the traced line pair connected between output bits 0 and 1 (first line pair 33) from input/output port 77. As such, when bits 0 and 1 are in a high impedance state, no square wave signal can be generated across first line pair 33.

Step 9, microcontroller 73 maintains the values presently written to bits 0 through 7 for half the period of a predesignated second frequency. The second frequency is a frequency different than the first frequency.

Step 10, the values presently written to bits 0 through 7 are complemented. Complementing bits 0 and 1 has no effect on the voltage across the traced line pair connected between bits 0 and 1 (first line pair 33) because these bits are in a high impedance state and are therefore essentially disconnected from first line pair 33. Each time Step 10 is executed, the voltage across second line pair 49 and third line pair 65 is reversed. By repeatedly switching the bits connected to second line pair 49 and third line pair 65 from a low state (0 v) to a high state (5 v) and from a high state (5 v) to a low state (0 v) at the regular interval determined by Step 9 (half the second frequency), a square wave signal having the second frequency is generated across second line pair 49 and third line pair 65.

Step 11, the time period during which the square wave signal having the second frequency has been generated is measured. One way this can be accomplished is by counting the number of times the program has looped through steps 9, 10 and 11. If the time period the square wave signal having the second frequency has been generated is less than 0.3 seconds microcontroller 73 returns to Step 9. If the time period the square wave signal having the second frequency has been generated is greater than or equal to 0.3 seconds microcontroller 73 proceeds to Step 12.

Step 12, bits 0, 1, 2 and 3 are set to a high impedance state. Setting bits 0, 1, 2 and 3 to a high impedance state is effectively the same as physically disconnecting the traced line pair connected between bits 0 and 1 (first line pair 33) and the traced line pair connected between bits 2 and 3 (second line pair 47) from input/output port 77. As such, when bits 0, 1, 2 and 3 are in a high impedance state, no square wave signal can be generated across first line pair 33 and second line pair 49.

Step 13, microcontroller 73 maintains the values presently written to bits 0 through 7 for half the period of a predesignated third frequency. (The third frequency is a different frequency than both the first frequency and the second frequency).

Step 14, the values presently written to bits 0 through 7 are complemented. Complementing bits 0, 1, 2 and 3 has no effect on the voltage across the traced line pair connected between output bit 0 and 1 (first line pair 33) and the traced line pair connected between output bit 2 and 3 (second line pair 49) because these output bits are in a high impedance state and are therefore essentially disconnected from the traced line pairs connected between these output bits (first line pair 33 and second line pair 49). Each time Step 14 is executed the voltage across third line pair 65 is reversed. By repeatedly switching the bits connected to third line pair 65 from a low voltage state (0 v) to a high voltage state (5 v) and from a high voltage state (5 v) to a low voltage state (0 v) at a regular interval (half the third frequency) determined by Step 13, a square wave signal is generated across third line pair 65. The frequency of this square wave signal is determined by the delay of Step 13.

Step 15, the time period during which the square wave signal having the third frequency has been generated is measured. This can be accomplished by counting the number of times the program has looped through steps 13, 14 and 15. If the time period the square wave signal having the third frequency has been generated is less than 0.3 seconds microcontroller 73 returns to block 13. If the time period the square wave signal having the third frequency has been generated is greater than or equal to 0.3 seconds microcontroller 73 proceeds to Step 16.

Step 16, bits 0, 1, 2 and 3 are returned to a low impedance state. Returning bits 0, 1, 2 and 3 to a low impedance state allows square wave signals to be applied across the traced line pair connected between output bits 0 and 1 (first line pair 33) and the traced line pair connected between output bits 2 and 3 (second line pair 49). Microcontroller 73 then returns to Step 5 wherein the process of generating a square wave signal having the first frequency on first line pair 33, second line pair 49 and third line pair 65 is repeated. A continuous loop is therefore formed wherein the square wave signal having the first frequency is generated on first line pair 33, second line pair 49 and third line pair 65 followed by the square wave signal having the second frequency being generated on second line pair 49 and third line pair 65, followed by the square wave signal having the third frequency being generated on only third line pair 65. This is depicted in FIG. 2.

The foregoing description discloses only the preferred embodiments of the invention, modifications of the above disclosed apparatus and method which fall within the scope of the invention will be readily apparent to those skilled in the art. For example, although the invention is described for tracing 3 line pairs, by creating a unique set of frequency signals for each line pair, or by creating a unique pattern of application of a frequency signal for each line pair, the method and apparatus of the present invention is useful for tracing any number of line pairs. Thus, by creating additional frequency signals, and/or by varying the patterns of application of frequency signals to each traced line pair, and/or by varying the time periods during which frequency signals are applied to each traced line pair, an infinite number of line pairs may be traced. Additionally, signal parameters other than frequency may be varied in order to create unique sets of signals. Variations in signal characteristics other than frequency (i.e. amplitude, etc.) may require the use of additional detection instrumentation that would be obvious to a worker of ordinary skill in the art.

Further, although the method and apparatus disclosed is described for use in tracing transmission line pairs (and specifically for tracing telephone transmission line pairs), the method and apparatus of the present invention is also useful for tracing other electrical transmission means such as coaxial cables and power cables. Additionally, the switches of FIG. 1 may be replaced with an appropriate configuration of logic gates for achieving the switching function. The electronic timer/controller 11 and switching controller 19 may be eliminated and timing and switching may be performed manually. Further, the hard-wired circuit of FIG. 1 is not limited to the specific interconnection of circuit elements shown in FIG. 1, and modifications thereof which fall within the spirit and scope of the invention will become readily apparent to those skilled in the art. Naturally, the specific unique sets of frequency signals disclosed in FIG. 2, and the time periods for their application may assume infinite variations. The microcontroller of FIG. 3, although shown with an on-board timer, may employ a timer external to the microcontroller. Also, a single switch (FIG. 1) or a single bit (FIG. 3) may control application of the frequency signal to a single line such as a coaxial cable or power cable. Further, while a single signal generator is preferred, a configuration which uses more than one signal generator will work provided the signal generators are completely isolated from one another. Finally, variations of the program shown in FIG. 4 will be readily apparent to those skilled in the art.

While the present invention has been disclosed in connection with the preferred embodiment thereof, it should be understood that there may be other embodiments which fall within the spirit and scope of the invention as defined by the following claims.

I claim:

1. A method of tracing a plurality of transmission lines from a first location to a second location, comprising the steps of:

generating a signal;

respectively applying, at the first location, a unique pattern of said signal to each transmission line to be traced, wherein each said transmission line receives a unique pattern of said signal that differs from the pattern of said signal applied to any other of said transmission lines;

detecting, at the second location, said unique pattern of said signal respectively applied to each said transmission line, thereby allowing the identity of each said transmission line to be determined according to the unique pattern respectively applied at the first location and detected at the second location; and wherein the step of applying said unique pattern of said signal comprises selectively connecting and disconnecting each transmission line to a signal generator.

2. A method of tracing a plurality of transmission lines from a first location to a second location, comprising the steps of:

generating a signal;

respectively applying, at the first location, a unique pattern of said signal to each transmission line to be traced, wherein each said transmission line receives a unique pattern of said signal that differs from the pattern of said signal applied to any other of said transmission lines;

detecting, at the second location, said unique pattern of said signal respectively applied to each said transmission line, thereby allowing the identity of each said transmission line to be determined according to the unique pattern respectively applied at the first location and detected at the second location; and wherein applying said unique pattern comprises timed selective application of said signal so as to simultaneously apply the unique pattern of said signal to each said transmission line.

3. A method of tracing a plurality of transmission lines from a first location to a second location comprising the steps of:

generating, at the first location, a series of signals which alternate between a high signal and a low signal at a predetermined frequency, thereby generating a frequency signal;

respectively applying a unique pattern of said frequency signal to each transmission line to be traced;

detecting, at the second location, said unique pattern of said frequency signal respectively applied to each said transmission line, thereby allowing the identity of each said transmission line to be determined according to the unique pattern of said frequency signal respectively applied at the first location and detected at the second location; and wherein said applying step comprises timed selective application of said frequency signal so as to simultaneously apply said unique pattern of said frequency signal to each said transmission line.

4. A method of tracing a plurality of transmission lines from a first location to a second location, comprising the steps of:

generating a plurality of signals, each said signal having a unique characteristic;

respectively applying, at the first location, a unique pattern of said signals to each transmission line to be traced, wherein each said transmission line receives a unique pattern of said signals that differs from the pattern of said signals applied to any other transmission line;

detecting, at the second location, said unique pattern of said signals respectively applied to each said transmission line, thereby allowing the identity of each said transmission line to be determined according to the unique pattern respectively applied at the first location and detected at the second location; and wherein the step of applying said unique pattern of said signals comprises selectively connecting and disconnecting each transmission line to a signal generator.

5. The method of claim 4 wherein said unique characteristic is a unique frequency.

6. The method of claim 4 wherein a number of said signals is applied to each transmission line such that the number of said signals applied to a given transmission line corresponds to a number assigned to the given transmission line, thereby allowing each said transmission line to be easily identified at the second location according to the number of said signals detected thereon.

7. An apparatus for tracing a plurality of transmission lines from a first location to a second location, comprising:

a signal generator means for outputting a series of signals each having a unique characteristic;

a switching means for selectively connecting and disconnecting said signal generator means to each transmission line to be traced; and a switching control means for controlling said switching means so as to apply a unique pattern of said signals to each said transmission line, thereby allowing the identity of each said transmission line to be determined according to the unique pattern of said signals applied thereto.

8. The apparatus of claim 7 further comprising a signal generator control means for controlling the timing and the unique characteristic of said signals.

9. The apparatus of claim 8 wherein said signal generator control means controls the time period during which each said signal is generated.

10. The apparatus of claim 8 wherein said signal generator means, said switching means, said switching control means and said signal generator control means all comprise a programmed microcontroller.

11. The apparatus of claim 7 wherein the signal generator means includes a single signal generator.

12. The apparatus of claim 7 wherein the signal generator means comprises a plurality of signal generators.

13. The apparatus of claim 7 wherein said unique characteristic is a unique frequency.

14. A method for tracing a plurality of transmission lines from a first location to a second location, comprising the steps of:

generating, at the first location, a series of signals which alternate between a high signal and a low signal at a first predetermined frequency, thereby generating a first frequency signal;

generating, at the first location, a series of signals which alternate between a high signal and a low signal at a second predetermined frequency, thereby generating a second frequency signal;

respectively applying, at the first location, a unique set of said frequency signals to each transmission line to be traced; and detecting, at the second location, said unique set of said frequency signals respectively applied to each said transmission line thereby allowing the identity of each said transmission line to be determined according to the unique set of said signals respectively applied at the first location and detected at the second location.

15. The method of claim 14 wherein the first frequency signal and the second frequency signal are generated by a single signal generator.

16. The method of claim 14 wherein a microcontroller having a plurality of output bits is employed and wherein a select number of said output bits are each connected to one of said transmission lines wherein said applying step comprises selectively placing at least one of said select number of said output bits in a high impedance state, so as to prevent application of said frequency signals to the transmission line connected thereto.

17. The method of claim 14 wherein said high signal and said low signal are voltage signals.

18. The method of claim 14 wherein the unique set of said frequency signals applied to one of said transmission lines consists of the first frequency signal and the second frequency signal, and the unique set of said frequency signals applied to another one of said transmission lines consists of the first frequency signal.

19. The method of claim 16 wherein said applying step comprises timed selective application of each said frequency signal so as to simultaneously apply the unique sets of frequency signals to each said transmission line.

* * * * *